United States Patent
Moslehi et al.

[11] Patent Number: 6,126,790
[45] Date of Patent: Oct. 3, 2000

[54] METHOD OF MAGNETICALLY ORIENTING THIN MAGNETIC FILMS WITH A MULTIPLE-COIL ELECTROMAGNET

[75] Inventors: Mehrdad M. Moslehi, Los Altos, Calif.; Shiyuan Cheng, Richardson; Cecil J. Davis, Greenville, both of Tex.; Dorian Heimanson, Foster City, Calif.

[73] Assignee: CVC Products, Inc., Rochester, N.Y.

[21] Appl. No.: 09/499,144

[22] Filed: Feb. 7, 2000

Related U.S. Application Data

[62] Division of application No. 09/083,363, May 22, 1998, Pat. No. 6,042,707.

[51] Int. Cl.[7] .............................. C23C 14/35; H01F 5/00
[52] U.S. Cl. ................................... 204/192.1; 204/192.11; 204/192.12; 204/192.13; 204/192.16; 204/298.02; 204/298.03; 204/298.04; 204/298.17; 204/298.19; 204/298.09; 335/209; 335/299; 335/213; 335/297; 335/306; 335/282; 118/723 FE; 118/723 FI; 427/571; 427/598
[58] Field of Search ........................ 204/192.1, 192.11, 204/192.12, 192.13, 298.16, 298.02, 298.03, 298.04, 298.17, 298.19, 298.09; 335/209, 299, 213, 297, 306, 282; 118/723 FE, 723 FI; 427/571, 598

[56] References Cited

U.S. PATENT DOCUMENTS

| | | |
|---|---|---|
| 3,077,444 | 2/1963 | Hoh . |
| 3,336,154 | 8/1967 | Oberg et al. . |
| 4,094,764 | 6/1978 | Boucher et al. . |
| 4,155,825 | 5/1979 | Fournier . |
| 4,247,383 | 1/1981 | Greve et al. . |
| 4,404,534 | 9/1983 | Janvrin .................................. 336/197 |
| 4,581,118 | 4/1986 | Class et al. . |
| 4,595,482 | 6/1986 | Mintz . |
| 4,673,482 | 6/1987 | Setoyama et al. . |
| 4,810,346 | 3/1989 | Wolf et al. . |
| 4,849,250 | 7/1989 | Dee et al. . |
| 4,853,102 | 8/1989 | Tateishi et al. . |
| 4,865,709 | 9/1989 | Nakagawa et al. . |
| 4,871,433 | 10/1989 | Wagner et al. . |
| 5,006,218 | 4/1991 | Yoshida et al. . |
| 5,006,219 | 4/1991 | Latz et al. . |

(List continued on next page.)

FOREIGN PATENT DOCUMENTS

| | | |
|---|---|---|
| 60-173819 | 9/1985 | Japan . |
| 61-161704 | 7/1986 | Japan . |
| 62-232911 | 10/1987 | Japan . |
| 3-056671 | 3/1991 | Japan . |
| 3-87365 | 4/1991 | Japan . |

OTHER PUBLICATIONS

Paper entitled "Manufacturing Techniques", pp. 1–28, (Date Unknown).

"Ferromagnetic Properties of Films" by Mitchell S. Cohen, M.I.T. Lincoln Laboratory, Lexington, Mass., Ch.17, pp. 17–1 thru 17–43. (Date Unknown).

"Relation of Thickness and Some Physical Properties of NiFe Thin Films" by R.M. Valletla, G. Guthmiller, and G. Gorman, J. Vac. Sci. Technol. A9 (4) Jul./Aug. 1991, American Vacuum Society, pp. 2093–2098.

*Primary Examiner*—Alan Diamond
*Attorney, Agent, or Firm*—Eugene Stephens & Associates

[57] ABSTRACT

An electromagnet assembly magnetically orients a thin magnetic film deposited onto a surface of a substrate. The magnetic orientation can take place in a low-pressure processing environment such as during the deposition of the thin magnetic film or during a subsequent operation such as annealing. The electromagnet assembly includes a plate-shaped core located adjacent to the substrate and two or more electromagnetic coils that are wrapped in different directions around the core. Electrical currents conveyed through the electromagnetic coils are controlled for orienting a substantially uniaxial magnetic field throughout a range of angular positions in a plane of the substrate surface.

15 Claims, 8 Drawing Sheets

U.S. PATENT DOCUMENTS

| | | |
|---|---|---|
| 5,026,470 | 6/1991 | Bonyhard et al. . |
| 5,045,166 | 9/1991 | Bobbio . |
| 5,061,838 | 10/1991 | Lane et al. . |
| 5,117,212 | 5/1992 | Yakamoto et al. ................. 335/210 |
| 5,367,277 | 11/1994 | Kaidou .................... 335/229 |
| 5,460,684 | 10/1995 | Saeki et al. ............. 156/345 |
| 5,612,098 | 3/1997 | Tan et al. . |
| 5,616,370 | 4/1997 | Okuno et al. . |
| 5,630,916 | 5/1997 | Gerrish et al. ................ 204/192.2 |
| 5,858,180 | 1/1999 | Hsu ................... 204/192.12 |
| 5,902,466 | 5/1999 | Gerrish et al. ............... 204/298.16 |
| 6,042,707 | 3/2000 | Moslehi et al. ................ 204/298.16 |
| 6,051,113 | 4/2000 | Moslehi .............. 204/192.12 |

METHOD OF MAGNETICALLY ORIENTING THIN MAGNETIC FILMS WITH A MULTIPLE-COIL ELECTROMAGNET

RELATED APPLICATIONS

This application is a Division of parent application Ser. No. 09/083,363, filed May 22, 1998, now U.S. Pat. No. 6,042,707 by Mehrdad M. Moslehi, Shiyuan Cheng, Cecil J. Davis, and Dorian Heimanson, entitled MULTIPLE-COIL ELECTROMAGNET FOR MAGNETICALLY ORIENTING THIN FILMS. The prior application is hereby incorporated by reference.

TECHNICAL FIELD

Thin magnetic films deposited (e.g., by physical-vapor deposition processes such as plasma sputtering and ion-beam deposition methods) onto substrates in low-pressure processing environments can be magnetically oriented to a single axis, a condition referred to as "uniaxial anisotropy", by exposing the films to orienting magnetic fields with sufficient field strength that exhibit high magnetic flux uniformity and little angular skew on the substrate during the deposition or subsequent post-deposition processing of the films (such as magnetic annealing processes). Magnetic orientation of thin films can take place in conjunction with various applications including thin-film deposition and thermal anneal processes as well as thin-film magnetic metrology.

BACKGROUND

Thin-film magnetic recording heads are usually fabricated using a combination of material layers including one or more layers of thin soft and hard magnetic films, some of which may have magnetic domains oriented along one or multiple magnetic axes. Generally, the magnetic films are deposited onto substrates in low-pressure processing chambers by physical-vapor deposition (PVD) methods such as plasma sputtering or ion-beam deposition processes. The magnetic domains of these films are oriented by exposing the films to in-plane magnetic fields either during their deposition or during a subsequent processing step such as magnetic annealing. The magnetic fields have specific requirements specifying the upper limits for both "skew" (deviation in direction) and "non-uniformity" (deviation in magnitude). Typical in-plane magnetic field strengths are in the range of 50 to 100 Oersteds.

Either permanent magnets or electromagnets can be used for generating the substantially uniaxial magnetic fields. For example, Nakagawa et al. in U.S. Pat. No. 4,865,709 mount thin magnetic film substrates between pairs of permanent magnets on a substrate holder. Opposite poles of the magnets face each other for generating approximately uniaxial magnetic fields across the thin film surfaces of the substrates. However, the permanent magnets are difficult to position, have limited magnetic field strength and magnetic field adjustability, and are exposed to processing that can affect their long-term performance (resulting, for instance, in long-term field drift). Permanent magnets may also have detrimental effects on the PVD plasma uniformity and repeatability. Moreover, permanent magnets provide no or limited capability for field magnitude or orientation adjustments.

Setoyama et al. in U.S. Pat. No. 4,673,482 position a pair of magnetic field-generating coils on opposite sides of a substrate outside a low-pressure processing chamber in which the substrate is mounted. The coils are located at a considerable distance from the substrate, and only a small portion of the resulting magnetic field exhibits the required uniaxial characteristics. Magnetic field adjustability is also limited. Moreover, this type of magnetic field source can produce significant plasma non-uniformity and magnetic interference problems associated with magnetron PVD energy sources.

Co-assigned U.S. Pat. No. 5,630,916 to Gerrish et al., which names one of the inventors of this invention, overcomes many of these problems by positioning a plate-shaped electromagnet adjacent to the substrate positioned over a substrate support. The plate-shaped electromagnet is isolated from the processing environment by the substrate support (i.e., electromagnet located outside the vacuum processing chamber) but is still close to the substrate. The substantially planar plate-shape of the electromagnet, which parallels the substrate, produces a uniaxial field of high uniformity and relatively low skew in the immediate vicinity of the substrate surface. An angularly adjustable support provides for mechanically orienting the plate-shaped electromagnet with respect to the substrate support for fine tuning the magnetic orientation axis.

Some thin-film magnetic heads (e.g., giant magneto-resistive or GMR heads) require multiple layers of thin magnetic films with magnetic domains oriented in the same or different directions. The multiple magnetic film layers, which generally alternate with non-magnetic film layers, can be produced in separate operations, such as between PVD stations of a multi-chamber cluster tool or in combined in-situ process operations within the same low-pressure multi-target process chamber of a stand-alone or cluster tool system.

Okuno et al. in U.S. Pat. No. 5,616,370 provide two pairs of bulky Helmholtz coils on opposite sides of a substrate for producing perpendicular magnetic fields. Multiple targets are used for depositing alternating layers of magnetic and non-magnetic materials, and either of the two pairs of Helmholtz coils may be powered to orient the magnetic layers in common or perpendicular directions. However, the Helmholtz coils of Okuno et al., like the permanent magnets of Nakagawa et al., are exposed to the processing environment such as the plasma medium in a physical-vapor deposition system and do not share the capabilities of the plate-shaped electromagnet of Gerrish et al. Moreover, the magnetic fields generated by these coils can be partly distorted by the magnetic field of a magnetron sputtering energy source.

SUMMARY OF INVENTION

This invention makes possible precise control over the orientation of uniaxial magnetic fields for aligning the magnetic domains of thin magnetic films on substrates in various applications such as in-situ magnetic orientation in low-pressure physical-vapor deposition (PVD) and in magnetic thermal annealing processing systems. The precise control can involve orienting the magnetic fields to a single angular position with respect to the substrate for aligning magnetic domains of one or more thin film layers in the same direction or orienting the magnetic fields to more than one angular position between various thin-film layers of the substrates for aligning their magnetic domains in different pre-specified directions.

One embodiment involves a chuck assembly that supports a substrate in a low-pressure processing environment, such as a PVD chamber or a magnetic annealing chamber (which may be a low-pressure or an atmospheric chamber), for magnetically orienting a thin magnetic film being deposited or already deposited on a surface of the substrate. A chuck housing of the assembly supports a mounting surface for the substrate within the low-pressure processing environment. A plate-shaped electromagnet located within the chuck housing (preferably positioned on the atmospheric side) on the opposite side of the mounting surface from the substrate produces a substantially uniaxial magnetic field with low skew in a plane of the substrate surface. A plate-shaped core of the electromagnet has front and back surfaces that extend parallel to the plane of the substrate surface.

First and second separately powered (e.g., via two separate power supplies) electromagnetic coils are wrapped around the plate-shaped core, which comprises a soft magnetic material such as iron or magnetic steel. A first winding layer of the first electromagnetic coil is wrapped in a first angular direction around the plate-shaped core, and a first winding layer of the second electromagnetic coil is wrapped in a second angular direction around both the first winding layer of the first electromagnetic coil and the plate-shaped core. Second and succeeding winding layers of the first and second electromagnetic coils alternately wrap around each other in the first and second directions. At least one electrical power supply controls relative amounts of current conveyed through the first and second electromagnetic coils for adjusting the magnetic orientation of the uniaxial magnetic field in the plane of the substrate surface. Preferably, the power supply delivers an alternating current such as a bipolar square wave current to produce a switching (e.g., reversing) magnetic field on the substrate surface with a relatively small switching frequency (e.g., less than 10 Hertz). This low-frequency current switching eliminates the possibility of deposition process uniformity degradation due to the effects of the orienting magnetic field on the PVD plasma.

Each of the first and second electromagnetic coils produces a uniaxial magnetic field with low skew in the plane of the substrate. The first electromagnetic coil is wrapped around the plate-shaped core in the first direction for producing a first uniaxial magnetic field along a first magnetic axis. The second electromagnetic coil is wrapped around the plate-shaped core in the second direction for producing a second uniaxial magnetic field along a second magnetic axis. Preferably, the two magnetic axes are orthogonal, but other angular relationships are also possible.

A control system, which includes the power supply, regulates electrical current conveyed through the first and second electromagnetic coils for producing a compound uniaxial magnetic field that orients the magnetic domains of the magnetic film along a compound magnetic axis that lies in a plane defined by the first and second magnetic axes. The electrical current can be divided in different proportions between the first and second electromagnetic coils for orienting the compound magnetic axis throughout a 360 degree continuum of different angular positions within all four quadrants of the plane of the two magnetic axes. Of course, it would also be possible to drive only one electromagnetic coil at a time to produce a uniaxial magnetic field along the magnetic axis of the powered coil.

The preferred peripheral shape of the plate-shaped core is square for supporting a pair of orthogonally oriented electromagnetic coils, but a variety of other peripheral shapes can be used for supporting additional coils or coils in other orientations or for influencing the uniformity and skew of the resulting magnetic fields. Among these other peripheral shapes, regular polygonal shapes with straight sides and equal internal angles are preferred. For example, a plate-shaped core with a regular hexagonal periphery can be used to support two or three electromagnetic coils wrapped between parallel sides.

The invention can also be practiced as a method of orienting a magnetic film on a surface of a substrate. The plate-shaped electromagnet has first and second electromagnetic coils wrapped in different directions around a common core and is oriented substantially parallel to a plane of the substrate surface. Current is directed through the first electromagnetic coil for producing a first uniaxial magnetic field along a first magnetic axis. Current is also directed through the second electromagnetic coil for producing a second uniaxial magnetic field along a second magnetic axis. Relative amounts of the two current components are apportioned between the first and second electromagnetic coils for producing a compound uniaxial magnetic field that orients the magnetic domains of the magnetic film along a compound magnetic axis that lies in a plane defined by the first and second magnetic axes. Generally, the current (e.g., the switching square wave current) is apportioned in a constant ratio between the first and second electromagnetic coils for maintaining the compound magnetic axis in a fixed known orientation between 0 degrees and 360 degrees. However, the current can also be apportioned in a time-varying ratio to rotate or angularly oscillate the magnetic field through a range of angles as a function of time. For instance, $\sin(\omega t)$ and $\cos(\omega t)$ current sources can be used to drive the two coils in order to produce a dynamic field rotating at an angular frequency of $\omega$. A rotating field may be used during PVD of a magnetic film in order to randomize the magnetic domains.

The method can also be extended to orienting the domains of multiple layers of thin magnetic film in different directions. Within a single mounting of the substrate, two different layers of thin magnetic film can be oriented on the substrate. Currents are delivered in a first specified ratio between the first and second electromagnetic coils for producing a first compound uniaxial magnetic field that orients magnetic domains of the first layer of magnetic film along a first compound magnetic axis. During the deposition of the second layer of magnetic film, the currents can be delivered in a second specified ratio between the first and second electromagnetic coils for producing a second compound uniaxial magnetic field that orients magnetic domains of the second layer of magnetic film along a second compound magnetic axis. The two compound magnetic axes are generally oriented orthogonally, but a continuum of other orientations within the four quadrants of the plane are possible according to the different ratios of current used for orienting each of the compound axes. The specified ratios of current include exclusively driving a different one of the electromagnetic coils during the deposition of each layer.

DRAWINGS

DETAILED DESCRIPTION

Figure 1:
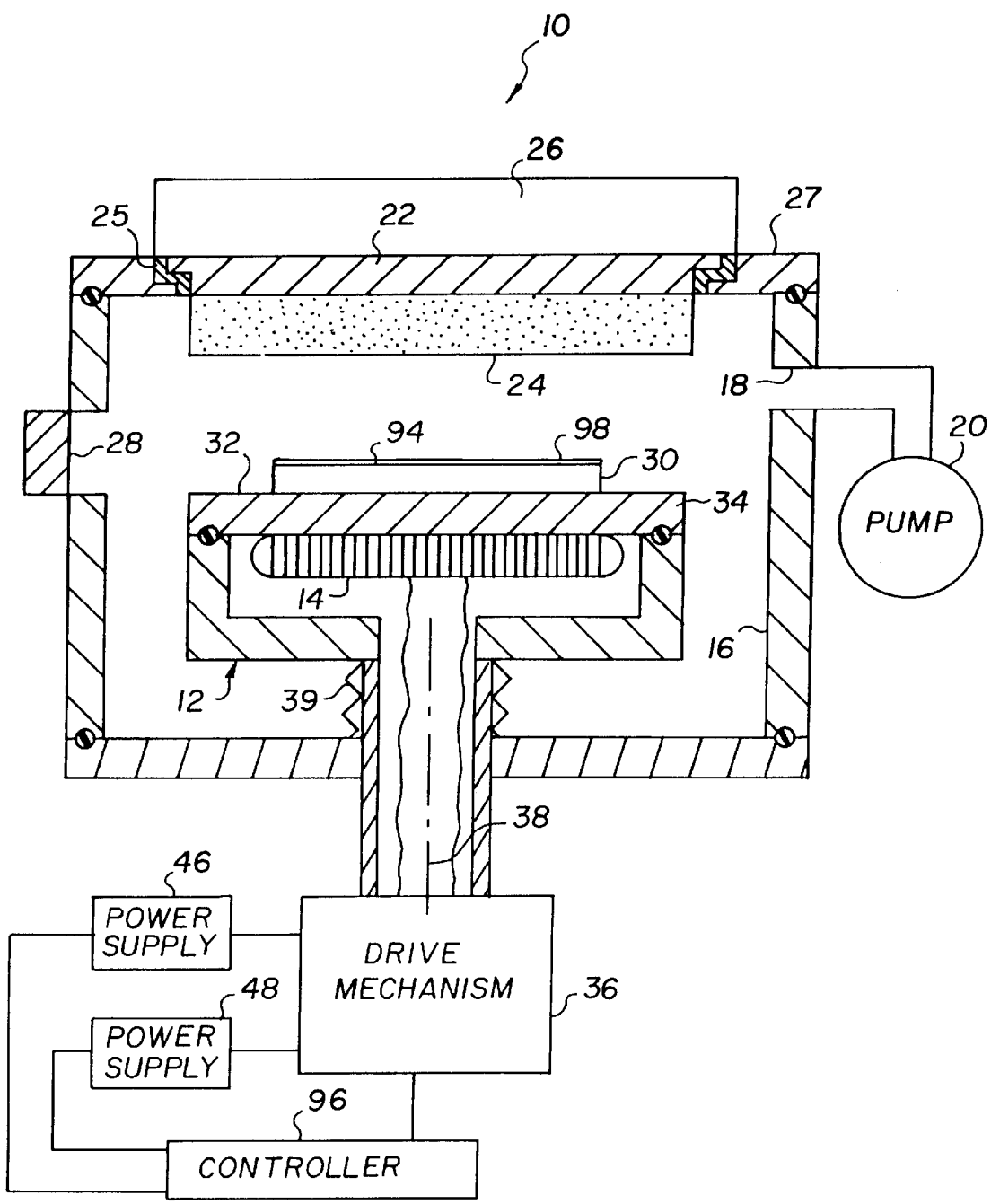
FIG. 1 is a cross-sectional schematic view of a low-pressure PVD processing chamber having a plate-shaped electromagnet for magnetically orienting thin films on a substrate.
Figure 2:
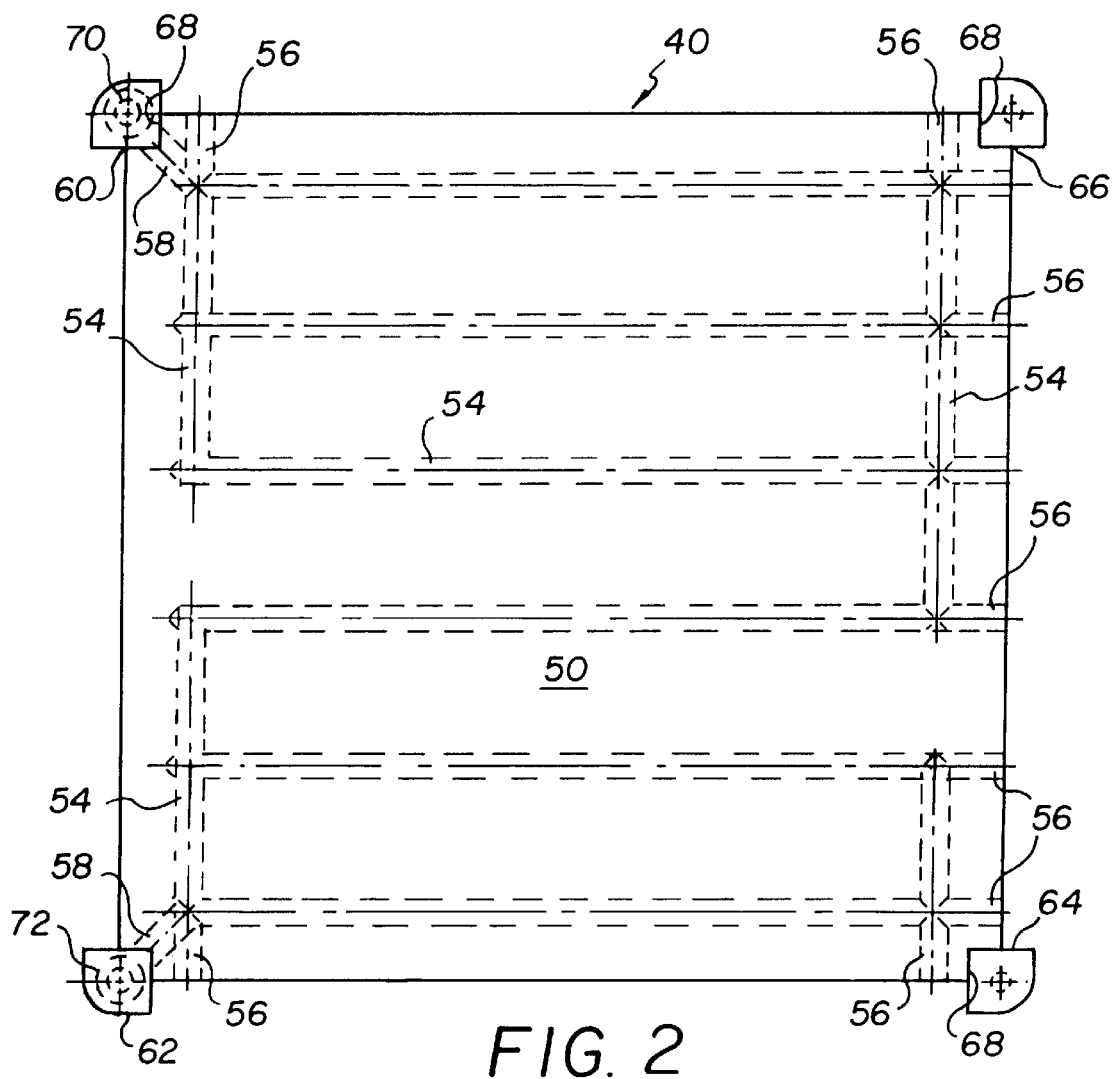
FIG. 2 is a plan view of a plate-shaped core of the electromagnet.
Figure 3:
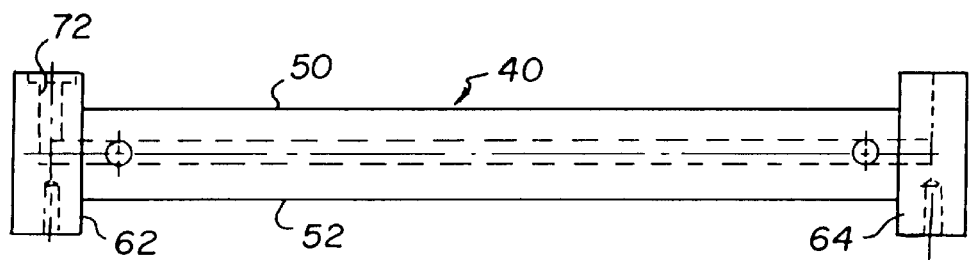
FIG. 3 is a side view of the plate-shaped core of FIG. 2.
Figure 4:
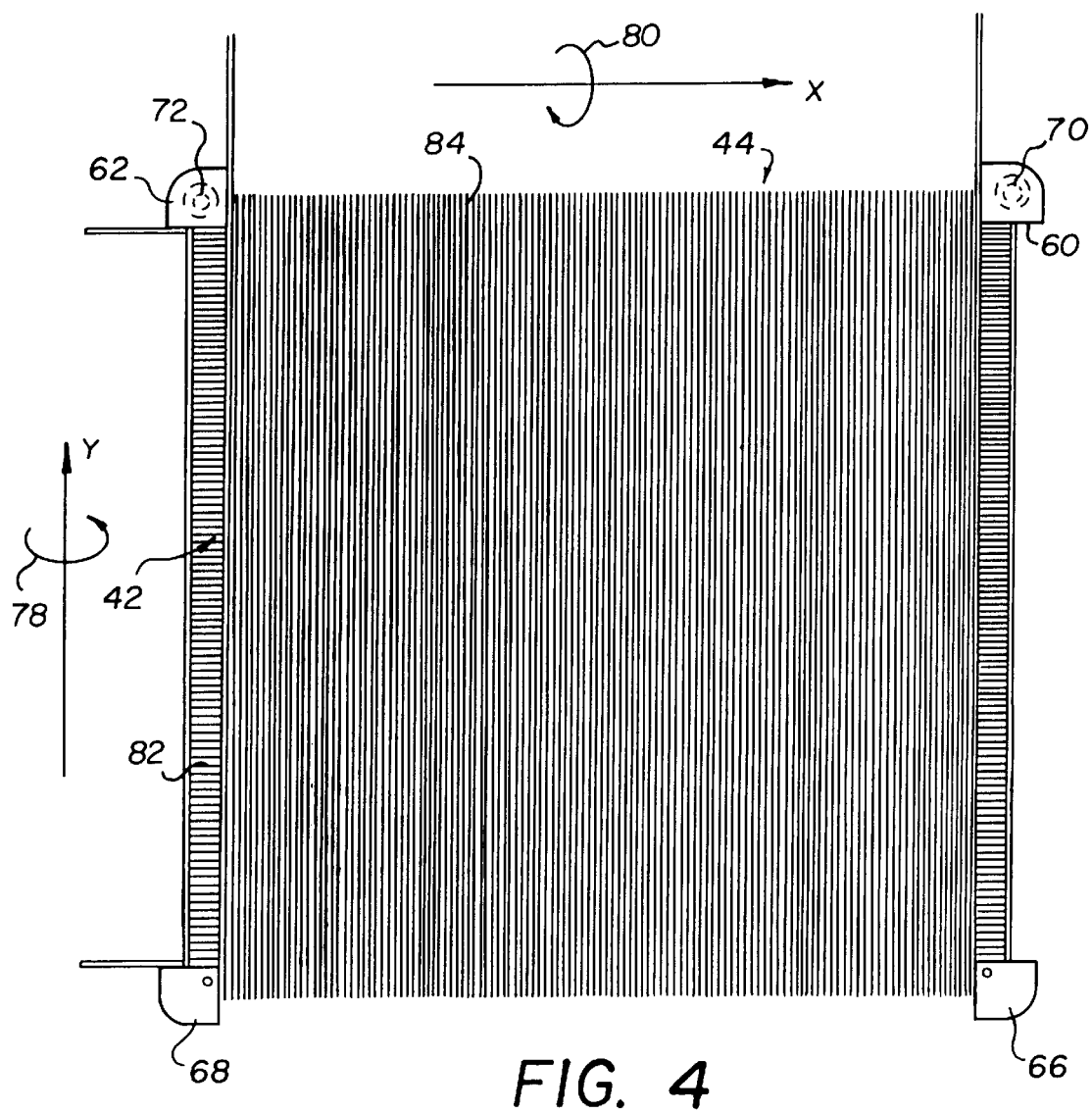
FIG. 4 is a plan view of the electromagnet showing first winding layers of two electromagnetic coils wrapped in orthogonal directions around the plate-shaped core.
Figure 5:
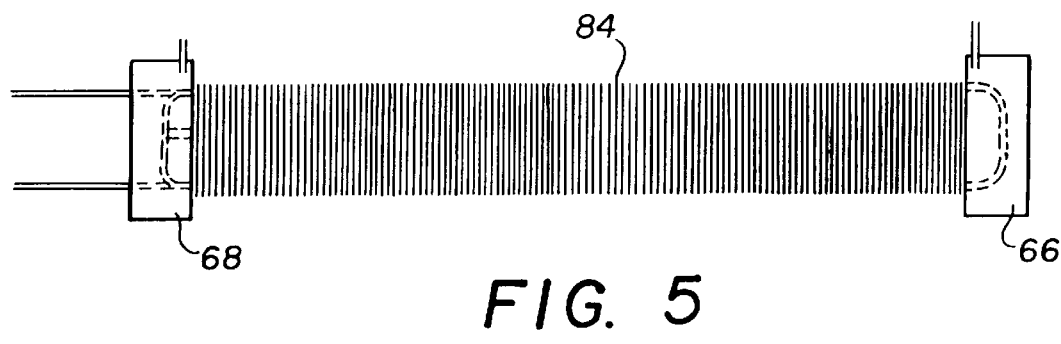
FIG. 5 is a side view of the same winding layers.
Figure 6:
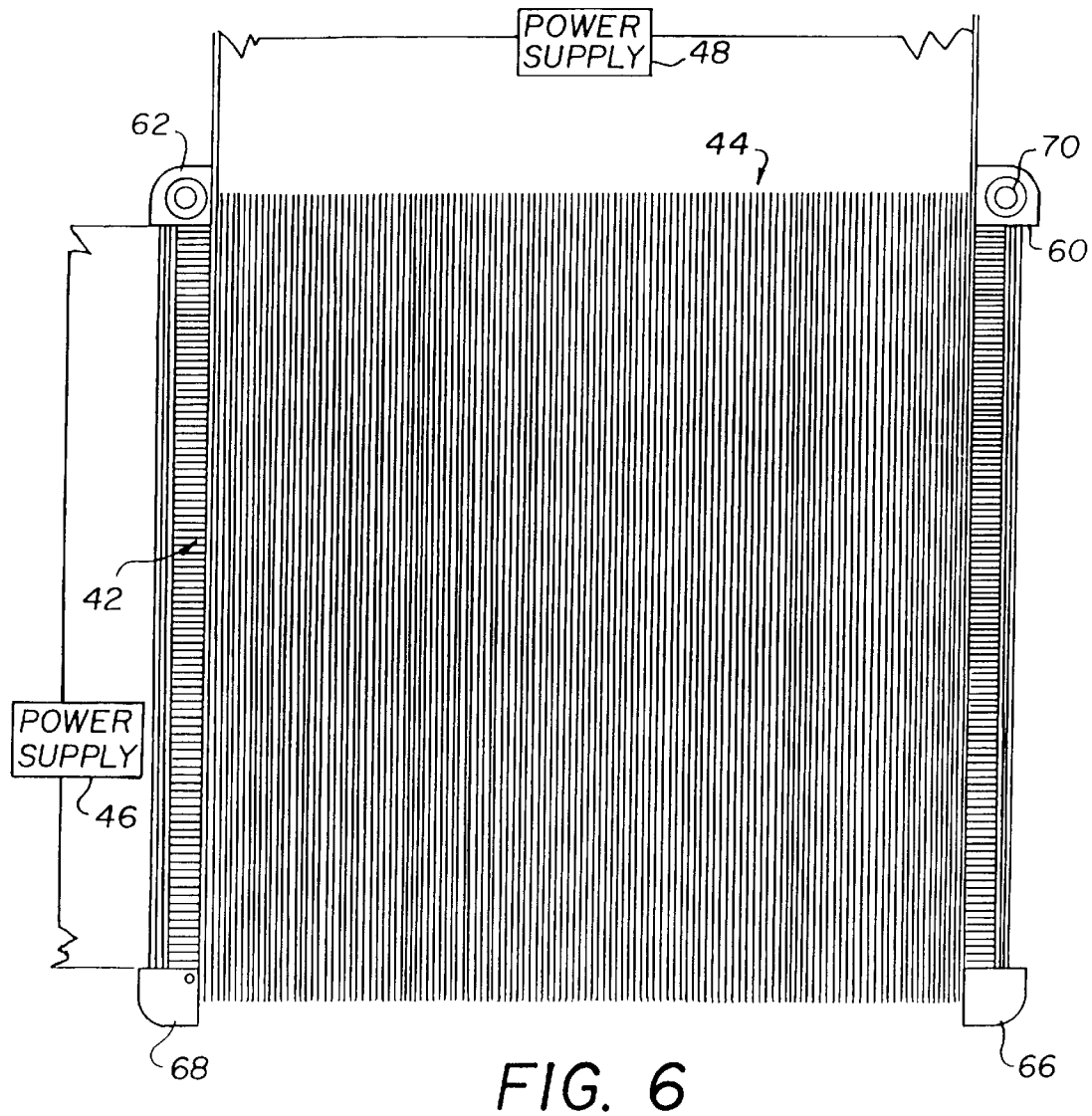
FIG. 6 is a plan view of the electromagnet with six winding layers of each electromagnetic coil wrapped around the plate-shaped core and two power supplies attached to the two orthogonal coils.
Figure 7:
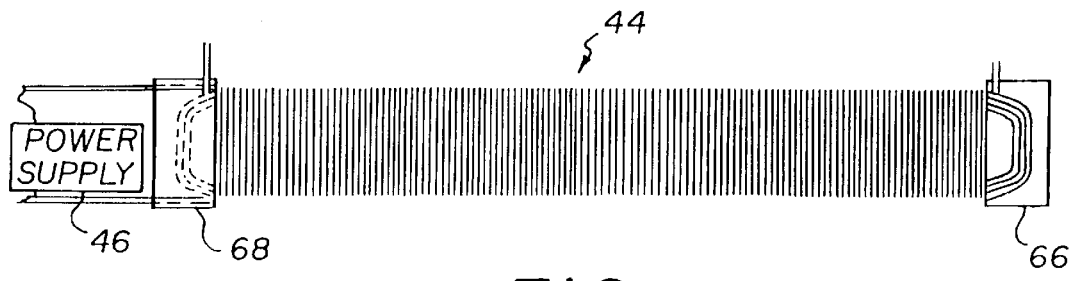
FIG. 7 is a side view of the six winding layers.

Referring to FIG. 1, a conventional thin-film sputtering apparatus 10 is shown with a chuck assembly 12 modified to incorporate a new dual-coil electromagnet 14. Conventional features include a low-pressure processing chamber 16 having an outlet port 18 connected to a vacuum pump 20 for evacuating air and plasma process gases from the chamber 16. Opposite to the chuck assembly 12 is an electrode or backing plate 22 supporting a target 24 of a material such as a soft or hard magnetic material, such as ferromagnetic alloys including NiFe, FeTaN, FeAlN, FeCrHfN, NeFeRe, Sendust, or Copt. A magnetron 26 provides electrical energy and regulates erosion of the target 24 during sputtering operations. The magnetron source 26 may be a DC magnetron or RF magnetron PVD energy source. Moreover, a non-magnetron energy source, such as RD diode, may also be used. The backing plate 22 receives the electrical power for target sputtering and is electrically isolated from a vacuum lid 27 using an insulating ring 25. An access valve 28 provides a resealable opening for moving a substrate 30 into and out of the chamber 16 (e.g., using a cluster tool central water handler).

The substrate 30 is supported on a mounting surface 32 of the chuck assembly 12. The mounting surface 32 is part of a mounting table 34 that can be arranged to regulate substrate temperature. For example, the table 34 can incorporate a heating unit, a cooling unit, or both. Heat exchanges between the table 34 and the substrate 30 can be facilitated by a heat-transfer gas. More detailed examples of chuck assemblies for regulating substrate temperature are found in commonly assigned U.S. patent application Ser. No. 08/938,293, filed Sep. 26, 1997, entitled "Two-Stage Sealing System for Thermally Conductive Chuck", and U.S. patent application Ser. No. 08/975,626, filed Nov. 21, 1997, entitled "Thermally Conductive Chuck for Vacuum Processor", which are both hereby incorporated by reference. Moreover the chuck assembly 12 may also provide a capability for electrical biasing such as RF biasing of the substrate.

A drive mechanism 36 provides for translating the chuck assembly 12 along an axis 38 toward or away from the target 24 in order to control the substrate-to-target spacing. Bellows 39 seal the chuck assembly 12 to the processing chamber 16 to accommodate a range of chuck assembly translation heights and to isolate the atmospheric components of the chuck assembly 12, including the new dual-coil electromagnet 14, from the evacuated space of the processing chamber 16 Sputtering and annealing operations for laying down and treating thin-film magnetic materials on substrates are well known. Co-assigned U.S. Pat. No. 5,630,916 describes a plate-shaped electromagnet incorporated into a chuck assembly for magnetically orienting such thin magnetic films. The relevant descriptions of this patent are also incorporated by reference.

The new dual-coil electromagnet 14, which is further illustrated in various stages of assembly by FIGS. 2–7, includes a plate-shaped core 40 and two electromagnetic coils 42 and 44 that are alternately wrapped around the core in orthogonal directions. A separate power supply 46 or 48 controls the flow of current through each of the electromagnetic coils 42 and 44.

The plate-shaped core 40 (shown best in FIGS. 2 and 3) has two square faces 50 and 52 and is preferably made of a single piece of a magnetically permeable material, such as a Ni—Fe alloy (permalloy), iron, or cold-rolled steel. Intersecting coolant passages 54 are gun drilled into the core 40 and fitted with plugs 56 to close superfluous openings. Diagonal passages 58 provide the only remaining openings. Nickel plating or other coatings can be used to protect the passages 54 and 58 from interactions with coolant.

Corner posts 60, 62, 64, and 66 mate with notches 68 formed in corners of the plate-shaped core 40. The corner posts 60, 62, 64, and 66 carry out several functions. For instance, two of the corner posts 60 and 62 include ports 70 and 72 for coupling coolant lines (not shown) to the diagonal passages 58 in the core 40. Locating the ports 70 and 72 in the corner posts 60 and 62 avoids interrupting the electromagnetic coils 42 and 44 and disrupting their associated magnetic fields.

The corner posts 60, 62, 64, and 66 also function as flanges or stoppers for confining the electromagnetic coils 42 and 44 on the core 40 and as field shapers for reducing skew and controlling uniformity of the resulting magnetic field across the substrate 30. In their capacity as field shapers, the corner posts 60, 62, 64, and 66 are made of a magnetically permeable material, such as iron. Increases in the height and mass of the corner posts 60, 62, 64, and 66 have been found to progressively reduce field skew. However, field uniformity and skew values reached an optimum at a given height.

A first winding layer 82 of the electromagnetic coil 42 (best seen in FIGS. 4 and 5) is wrapped around the core 40 in a first angular direction 78 taken around an axis "Y", and a first winding layer 84 of the electromagnetic coil 44 is wrapped around both the first winding layer 82 of the electromagnetic coil 42 and the core 40 in a second angular direction 80 taken around an axis "X". Second and succeeding winding layers (shown in FIGS. 6 and 7) of the two electromagnetic coils 42 and 44 are alternately wrapped over each other in the two angular directions 78 and 80 (shown in FIG. 8). The two axes "X" and "Y" are preferably orthogonal (90 degrees apart) axes; but other angular relationships are also possible, particularly for other core shapes.

Figure 8:
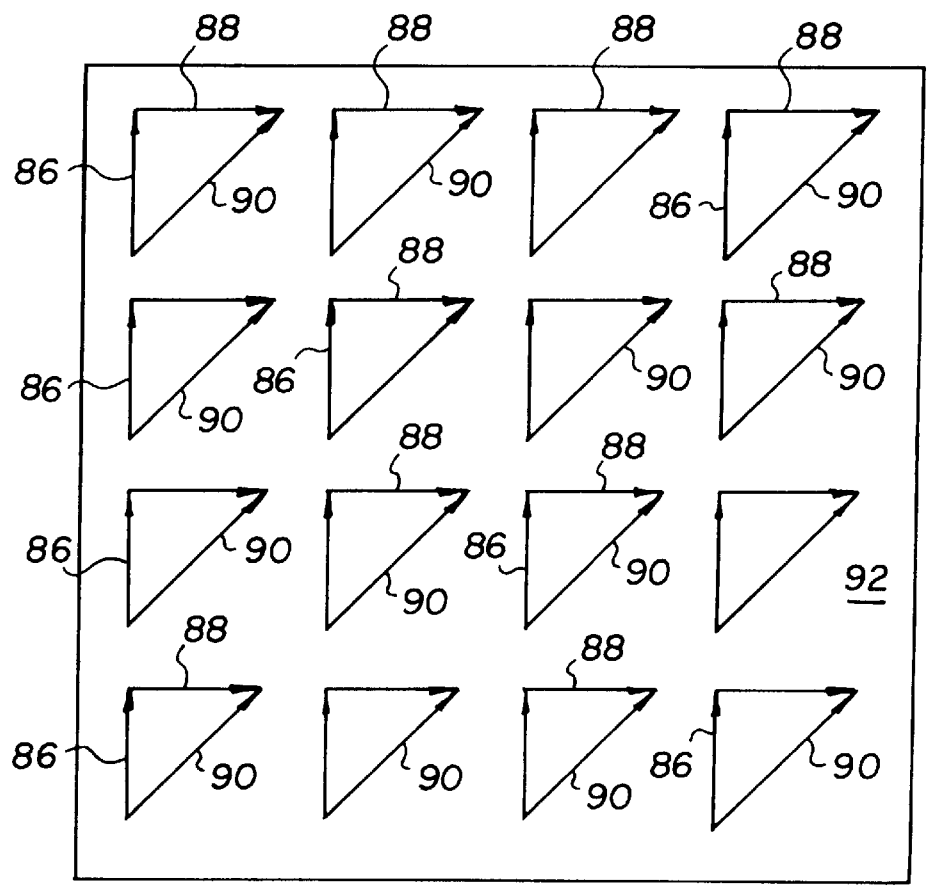
FIG. 8 is a diagram showing respective magnetic fields independently produced by the two orthogonal electromagnetic coils along with a compound vector sum magnetic field produced together by equally powering the two electromagnetic coils.
Figure 8:
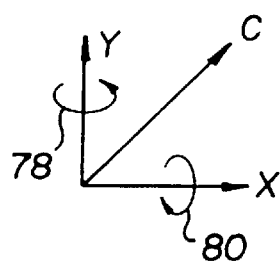

Referring to FIG. 8, which references a plane 92 tangent to a surface 94 of the substrate 30, the electromagnetic coil 42 produces a uniaxial magnetic field 86 that extends parallel with the "Y" axis in the plane 92. The electromagnetic coil 44 produces a similar uniaxial magnetic field 88 that extends parallel with the "X" axis in the plane 92. Together, the two magnetic fields 86 and 88 sum to produce a compound uniaxial magnetic field 90 that extends parallel with a compound axis "C" in the plane 92.

A controller 96, shown in FIG. 1, regulates outputs of the two power supplies 46 and 48 to adjust relative amounts of current conveyed by the two electromagnetic coils 42 and 44. Variations in the ratio of currents conveyed by the two electromagnetic coils 42 and 44 can be used to adjust the angular orientation of the compound axis "C" throughout a continuum of different angular positions between the "X" and "Y" axes. For example, if the electromagnetic coil 42 receives all of the current, then the compound axis "C" is oriented coincident with the "Y" axis; if the electromagnetic coil 44 receives all of the current, then the compound axis "C" is oriented coincident with the "X" axis; and if both electromagnetic coils 42 and 44 receive a share of the current, then the compound axis "C" includes components along both the "X" and "Y" axes that are combined having regard to their direction and magnitude (i.e., by vector addition) to orient the compound axis "C" in a new angular position in any of the four quadrants.

The compound uniaxial magnetic field 90 preferably exhibits minimum variations in angular direction (skew) and magnitude (uniformity) throughout the working area of the surface 94. To achieve these goals, the plate-shaped core 40 is preferably sized as large as possible within the allowable confines of the chuck assembly 12 and the low-pressure processing chamber 16 and is preferably positioned relatively close to the substrate 30 (i.e., the spacing between the core and the substrate is chosen to be a small fraction of the core diagonal dimension).

A magnetic film 98 on the substrate surface 94 can be magnetically oriented to a given angular position of the compound magnetic axis "C" by regulating the relative amounts of current that are directed through the two electromagnetic coils 42 and 44 (preferably synchronized switching square-wave or sinusoidal currents). Preferably, the total current is divided in a fixed ratio between the electromagnetic coils 42 and 44 to maintain the compound magnetic axis in a fixed angular position throughout the deposition or subsequent treatment (e.g., magnetic thermal annealing) of the magnetic film in the processing chamber 16. However, the current can be divided in the same or a different ratio during the deposition or treatment of a succeeding layer of magnetic film (not shown) for orienting magnetic domains of the film along the same or a differently oriented compound magnetic axis "C".

Figure 9:
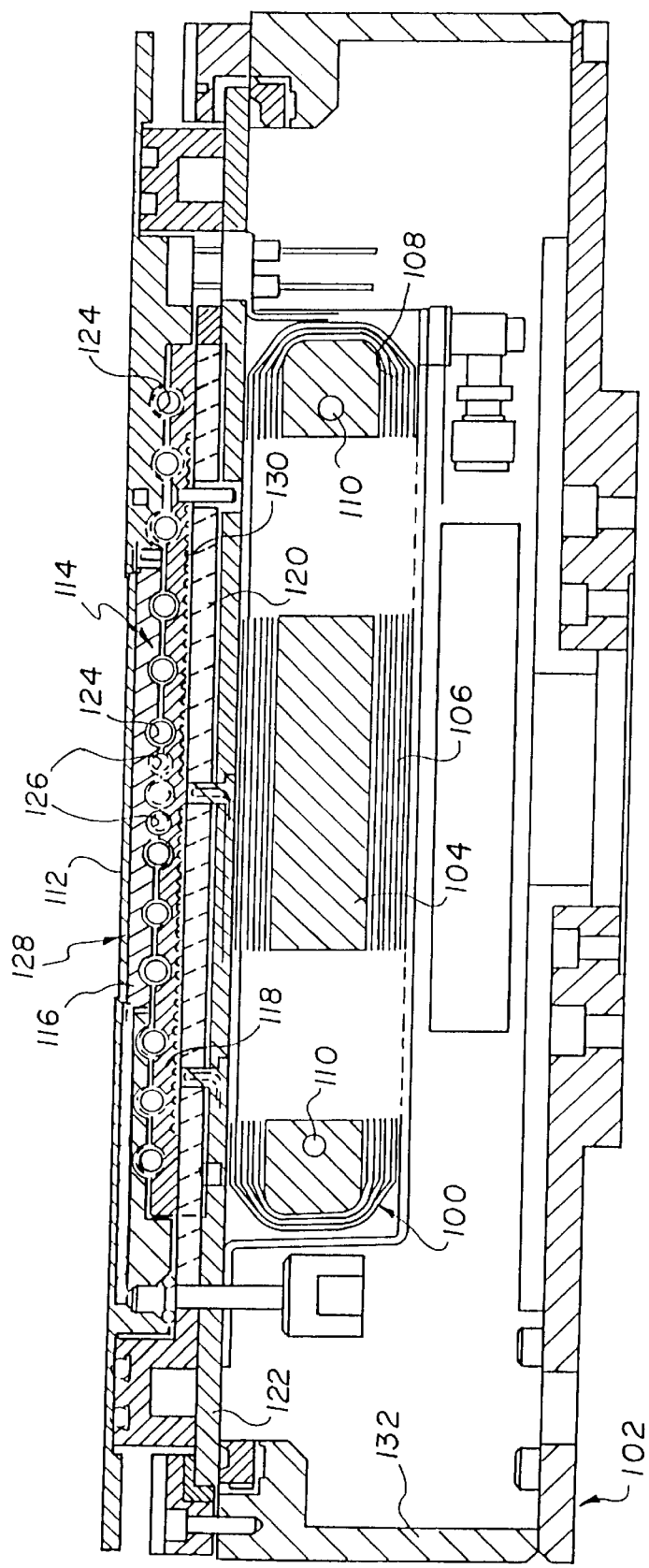
FIG. 9 is a cross-sectional view of a rapid-thermal-cycle chuck housing for supporting a similar plate-shaped electromagnet.

A similar plate-shaped electromagnet 100 is depicted in FIG. 9 mounted within a chuck assembly 102. The electromagnet 100 is assembled from a single plate-shaped core 104 and a pair of electromagnetic coils 106 and 108 that are alternately wrapped in orthogonal directions around the core 104. Passages 110 puncture the core 104 for circulating coolant throughout the core 104.

A substrate 112 is mounted on a pedestal 114 formed from an assembly of four plates 116, 118, 120, and 122. Heat-conducting plates 116 and 118, which are preferably made of copper, are machined to provide space for coolant conduits 124 that circulate coolant throughout the pedestal 114 and for gas conduits 126 for conveying a heat-transfer gas to and from a heat-transfer interface 128 between the substrate 112 and the pedestal 114. A heating unit 130 is embedded within the heat-conducting plate 118. Insulating plate 120, which is preferably made of ceramic, thermally isolates support plate 122 from the heating unit 130.

The electromagnet 110 is suspended from the support plate 122, which is sealed to a chuck housing 132 containing the electromagnet 100 to prevent out-gassing of the electromagnet 110 into the surrounding vacuum processing chamber (not shown). Despite the active substrate heating and cooling functions performed by the chuck assembly 102, the electromagnet 110 is still positioned reasonably close to the substrate 112, yet isolated from the lower pressure regions of the processing chamber. The temperature of the electromagnet 110 is preferably kept below 70 degrees using air or water cooling.

Figure 10:
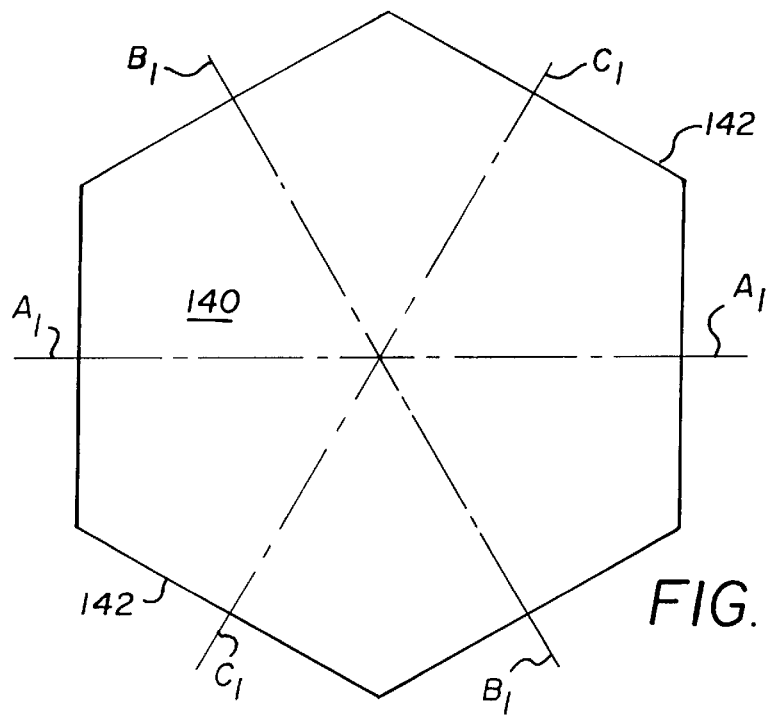
FIG. 10 is a schematic plan view of a plate-shaped electromagnet with a hexagonal core and three winding axes (corresponding to three pairs of parallel sides).
Figure 11:
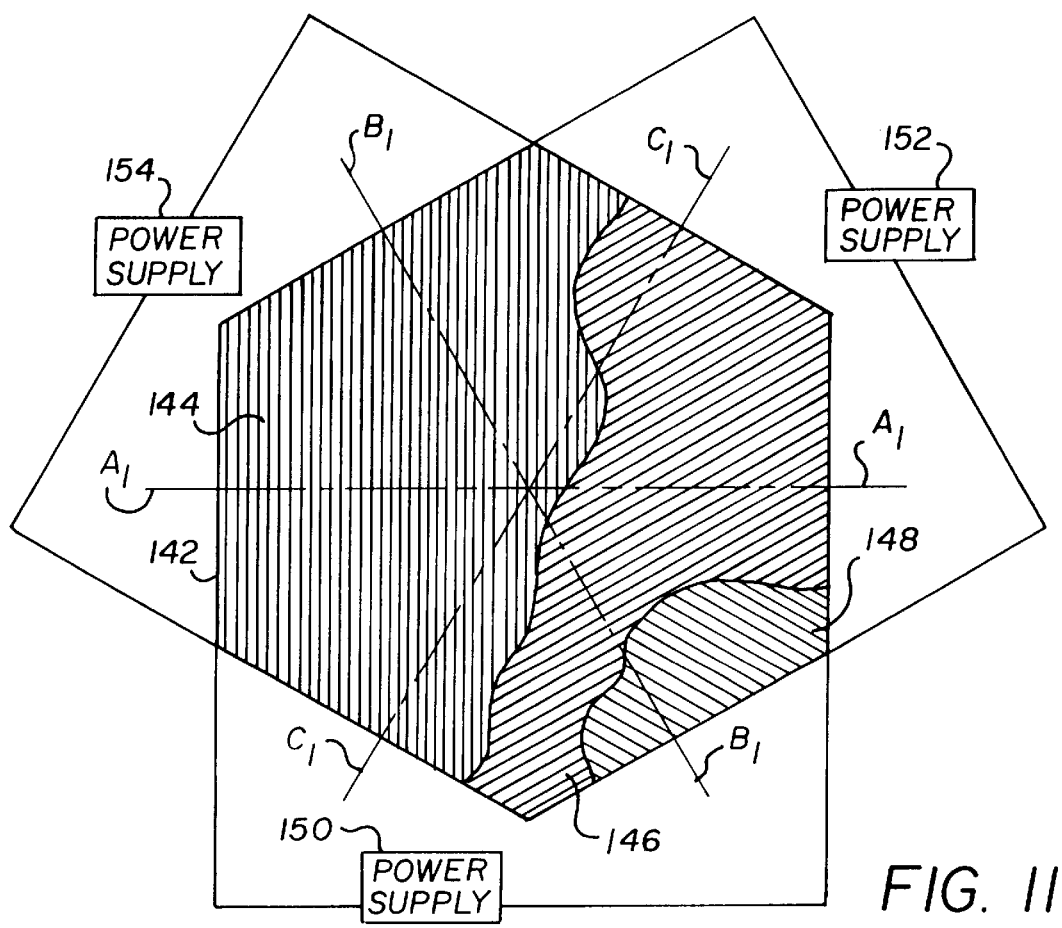
FIG. 11 is a schematic plan view of the same electromagnet showing in broken-away sections three electromagnetic coils with angular separations of 120 degrees.

The remaining drawing figures depict in a more schematic format other arrangements of core peripheries and coil combinations that further exemplify the invention. For example, FIGS. 10 and 11 illustrate a plate-shaped core 140 having a hexagonal periphery 142 and three winding axes "$A_1$", "$B_1$", and "$C_1$". Coils 144, 146, and 148 are wound around the three winding axes "$A_1$", "$B_1$", and "$C_1$" and are powered through three current regulating mechanisms 150, 152, and 154 (e.g., three separate power supplies). Any one, two, or all three coils 144, 146, and 148 can be powered at one time to produce a single or a compound uniaxial magnetic field. The coils 144, 146, and 148 can also be controlled dynamically to produce rotating or oscillating magnetic fields.

More or less than three angularly related coils 144, 146, and 148 can be supported by the plate-shaped core 140. For example, three additional coils could be wound around axes that bisect corners of the hexagonal periphery 142. The additional coils narrow the angular separation between winding axes and can provide more consistent magnetic fields throughout the remaining angular separation.

Figure 12:
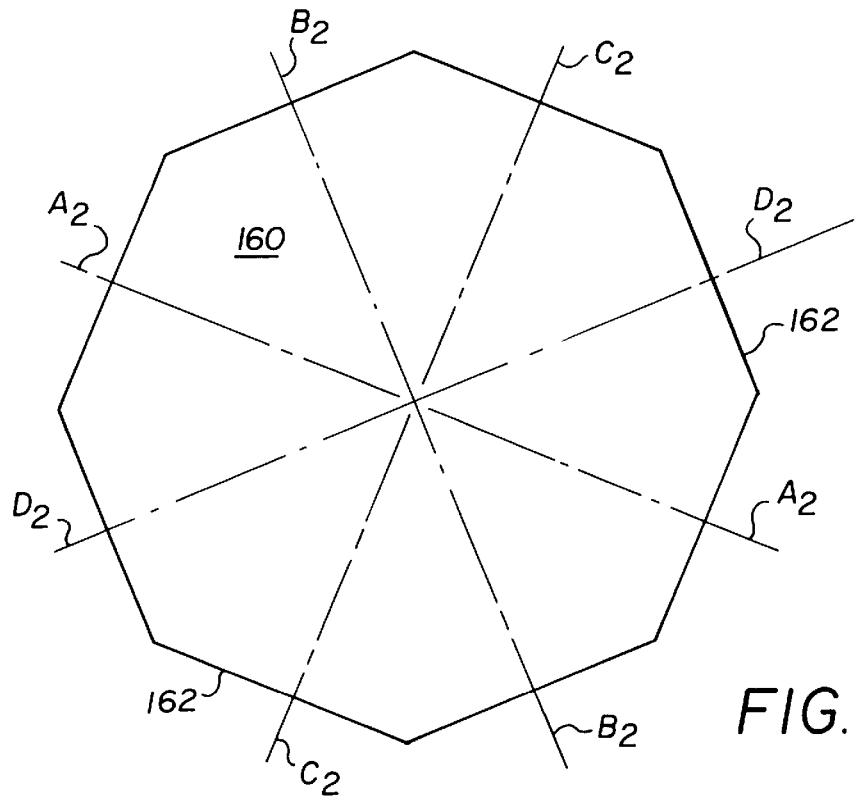
FIG. 12 is a schematic plan view of an alternative plate-shaped electromagnet with an octagonal core and four winding axes (corresponding to four pairs of parallel sides).

FIG. 12 illustrates a plate-shaped core 160 having an octagonal periphery 162 and four winding axes "$A_2$", "$B_2$", "$C_2$", and "$D_2$" that bisect the eight sides of the core periphery 162. Four separately controllable coils (not shown) can be wound around the four winding axes "$A_2$", "$B_2$", "$C_2$", and "$D_2$" to provide more combinations for controlling characteristics of a compound uniaxial magnetic field.

Figure 13:
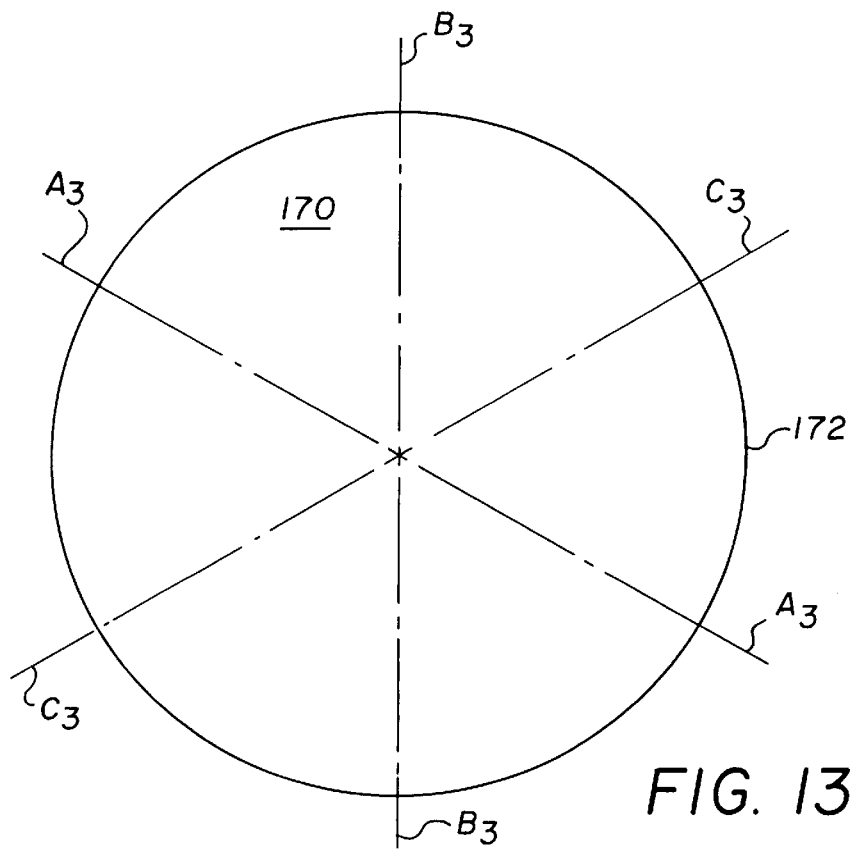
FIG. 13 is a schematic plan view of another electromagnet with a round plate-shaped core and three winding axes.

A polygonal limit condition in which a plate-shaped core 170 has a circular periphery 172 is depicted in FIG. 13. Only three winding axes "$A_3$", "$B_3$", and "$C_3$" are depicted in FIG. 13, but less or many more could also be used. The circular periphery 172 is expected to provide more consistent field results throughout a range of different angular field orientations, particularly during dynamic operation.

We claim:

1. A method of orienting a magnetic film on a surface of a substrate comprising the steps of:

orienting an electromagnet having first and second electromagnetic coils wrapped in different directions around a common core adjacent to the substrate's surface;

directing a flow of electrical current through the first electromagnetic coil for producing a first uniaxial magnetic field along a first magnetic axis;

directing a flow of electrical current through the second electromagnetic coil for producing a second uniaxial magnetic field along a second magnetic axis that extends in a direction different from the first magnetic axis; and regulating relative amounts of the electrical currents directed through the first and second electromagnetic coils for producing a compound uniaxial magnetic field that orients magnetic domains of the magnetic film along a compound magnetic axis that lies in a plane defined by the first and second magnetic axes.

2. The method of claim 1 in which said step of regulating relative amounts of the electrical currents includes delivering the currents in a pre-specified ratio between the first and second electromagnetic coils for maintaining the compound magnetic axis in a pre-specified orientation.

3. The method of claim 2 in which said pre-specified ratio of currents is a time-varying ratio of currents.

4. The method of claim 2 in which said pre-specified ratio of currents is a constant ratio of currents.

5. The method of claim 2 in which said pre-specified orientation of the compound magnetic axis encompasses a full angular range of 360 degrees.

6. The method of claim 5 in which said first and second magnetic axes are separated by at least 30 degrees.

7. The method of claim 1 including the further steps of mounting the substrate within a substrate processing chamber and processing a first layer of magnetic film on the substrate's surface.

8. The method of claim 7 in which said step of regulating the relative amounts of electrical currents includes delivering the currents in a first pre-specified ratio between the first and second electromagnetic coils for producing a first compound uniaxial magnetic field that orients magnetic domains of the first layer of magnetic film along a first compound magnetic axis.

9. The method of claim 8 including the further step of processing a second layer of magnetic film on the substrate's surface.

10. The method of claim 9 in which said step of regulating the relative amounts of electrical currents also includes delivering the currents in a second pre-specified ratio between the first and second electromagnetic coils for producing a second compound uniaxial magnetic field that orients magnetic domains of the second layer of magnetic film along a second compound magnetic axis that is oriented differently than the first compound magnetic axis.

11. The method of claim 10 in which the magnetic domains of the first and second layers of magnetic film are oriented along the different first and second compound magnetic axes without removing the substrate from the substrate processing chamber.

12. The method of claim 1 in which the common core has a first pair of parallel sides wrapped by the first electromagnetic coil, a second pair of parallel sides wrapped by the second electromagnetic coil, and corners between the sides.

13. The method of claim 12 in which coolant channels are formed within the core, and further comprising the step of connecting the coolant channels to a supply of coolant through the corners of the common core.

14. The method of claim 12 in which magnetically permeable posts are mounted in the corners of the core, and further comprising the step of adjusting the height of the corner posts above the common core to minimize skew of the compound uniaxial magnetic field.

15. The method of claim 11 in which the step of orienting includes orienting a plate-shaped electromagnet having first and second electromagnetic coils wrapped in different directions around a plate-shaped core parallel to a plane of the substrate's surface.

* * * * *